(12) United States Patent
Reed

(10) Patent No.: US 9,892,803 B2
(45) Date of Patent: Feb. 13, 2018

(54) CACHE MANAGEMENT REQUEST FUSING

(71) Applicant: VIA ALLIANCE SEMICONDUCTOR CO., LTD., Shanghai (CN)

(72) Inventor: Douglas R. Reed, Austin, TX (US)

(73) Assignee: VIA ALLIANCE SEMICONDUCTOR CO., LTD, Shanghai (CN)

(*) Notice: Subject to any disclaimer, the term of this patent is extended or adjusted under 35 U.S.C. 154(b) by 176 days.

(21) Appl. No.: 14/890,420

(22) PCT Filed: Nov. 26, 2014

(86) PCT No.: PCT/IB2014/003088
§ 371 (c)(1),
(2) Date: Nov. 10, 2015

(87) PCT Pub. No.: WO2016/042353
PCT Pub. Date: Mar. 24, 2016

(65) Prior Publication Data
US 2016/0283376 A1    Sep. 29, 2016

Related U.S. Application Data

(60) Provisional application No. 62/052,387, filed on Sep. 18, 2014.

(51) Int. Cl.
*G06F 12/08* (2016.01)
*G11C 29/38* (2006.01)
(Continued)

(52) U.S. Cl.
CPC .......... *G11C 29/38* (2013.01); *G06F 12/084* (2013.01); *G06F 12/0811* (2013.01);
(Continued)

(58) Field of Classification Search
None
See application file for complete search history.

(56) References Cited

U.S. PATENT DOCUMENTS 5,317,720 A * 5/1994 Stamm ............... G06F 9/3836
                                                     711/122
5,999,721 A    12/1999 Colglazier
(Continued)

FOREIGN PATENT DOCUMENTS

CN        1550994 A    12/2004
CN       101425042 A    5/2009
(Continued)

OTHER PUBLICATIONS

PCT/IB2014/003088. International Search Report (ISR) and Written Opinion (WO). Provided by State Intellectual Property Office of the P.R. China. dated Apr. 28, 2015. pp. 1-8.
(Continued)

*Primary Examiner* — Mano Padmanabhan
*Assistant Examiner* — Jean Edouard
(74) *Attorney, Agent, or Firm* — McClure, Qualey & Rodack, LLP

(57) ABSTRACT

A processor includes a plurality of processing cores and a cache memory shared by the plurality of processing cores. The cache memory comprises a size engine that receives a respective request from each of the plurality of processing cores to perform an operation associated with the cache memory. The size engine fuses the respective requests from two or more of the plurality of processing cores into a fused request. To perform the fused request the size engine performs a single instance of the operation and notifies each of the two or more of the plurality of processing cores that its respective request has been completed when the single instance of the operation is complete.

20 Claims, 8 Drawing Sheets

(51) Int. Cl.
*G06F 12/084* (2016.01)
*G06F 12/0842* (2016.01)
*G06F 12/0855* (2016.01)
*G11C 29/44* (2006.01)
*G06F 12/0811* (2016.01)
*G06F 12/0831* (2016.01)
*G06F 12/0864* (2016.01)
*G06F 12/0804* (2016.01)

(52) U.S. Cl.
CPC ...... *G06F 12/0833* (2013.01); *G06F 12/0842* (2013.01); *G06F 12/0857* (2013.01); *G06F 12/0864* (2013.01); *G11C 29/44* (2013.01); *G06F 12/0804* (2013.01); *G06F 2212/1024* (2013.01); *G06F 2212/6042* (2013.01)

(56) References Cited

U.S. PATENT DOCUMENTS

| | | | |
|---|---|---|---|
| 7,356,652 | B1 | 4/2008 | Dew et al. |
| 2006/0224835 | A1* | 10/2006 | Blumrich ............ G06F 12/0831 711/146 |
| 2007/0156963 | A1* | 7/2007 | Chen .................. G06F 12/0811 711/130 |
| 2008/0109637 | A1* | 5/2008 | Martinez ............ G06F 9/30181 712/29 |
| 2008/0244194 | A1* | 10/2008 | Blumrich ............ G06F 12/0822 711/146 |
| 2009/0070774 | A1* | 3/2009 | Raikin .................... G06F 9/524 718/108 |
| 2009/0248976 | A1* | 10/2009 | Rotithor ................ G06F 9/5016 711/113 |
| 2009/0249046 | A1 | 10/2009 | Berg et al. |
| 2010/0115248 | A1* | 5/2010 | Ouziel .................. G06F 9/3016 712/226 |
| 2011/0219208 | A1* | 9/2011 | Asaad .................... G06F 15/76 712/12 |
| 2011/0283124 | A1* | 11/2011 | Branover ............. G06F 1/3203 713/323 |
| 2013/0254488 | A1* | 9/2013 | Kaxiras ............. G06F 12/0815 711/130 |
| 2014/0052917 | A1 | 2/2014 | Koka et al. |
| 2014/0189305 | A1 | 7/2014 | Hickmann |
| 2015/0019824 | A1* | 1/2015 | Lilly .................. G06F 12/0862 711/137 |
| 2015/0169453 | A1* | 6/2015 | Shanbhogue ....... G06F 12/0808 711/105 |
| 2016/0293273 | A1 | 10/2016 | Hooker et al. |

FOREIGN PATENT DOCUMENTS

| | | |
|---|---|---|
| CN | 102929832 A | 2/2013 |
| JP | 2012043031 A | 3/2012 |
| WO | WO2010056511 | 5/2010 |

OTHER PUBLICATIONS

PCT/IB2014/003103. International Search Report (ISR) and Written Opinion (WO). Provided by State Intellectual Property Office of the P.R. China. dated Apr. 28, 2015. pp. 1-8.

\* cited by examiner

*FIG. 10*
⟋—912

```
DATA (202) PORTION OF BUS <== DATA (302) OF ENTRY
ADDRESS (204) PORTION OF BUS <== UPPER ADDRESS BITS (508) AND TAG (304) AND
MESI STATE (306) OF ENTRY
1002
```

*FIG. 11*
⟋—912

```
DATA (202) PORTION OF BUS <== TAG (304) AND MESI STATE (306) OF ENTRY
UPPER BITS OF ADDRESS (204) PORTION OF BUS <== UPPER ADDRESS BITS (508)
1102
```

CACHE MANAGEMENT REQUEST FUSING

CROSS-REFERENCE TO RELATED APPLICATIONS

This application claims priority based on U.S. Provisional Application, Ser. No. 62/052,387, filed Sep. 18, 2014, which is hereby incorporated by reference in its entirety.

This application is related to the following U.S. Non-Provisional application Ser. No. 14/890,421, filed concurrently herewith, which is a national stage application under 35 U.S.C. 371 of International Application PCT/IB2014/003103, filed Nov. 26, 2014, each of which is hereby incorporated by reference in its entirety.

BACKGROUND

Cache management operations can generally be relatively lengthy. This is becoming increasingly true as the size of caches increases. For example, the time required to perform a writeback invalidate operation to a large cache memory (e.g., 4 MB) may be significant and therefore disruptive to other operations of a processor that uses the cache memory. In the case of multiple processing cores that share the cache memory, the disruption may be exacerbated where the multiple processing cores make multiple lengthy cache management operation requests to the cache memory in close temporal proximity.

Additionally, diagnosing failures in modern processors can be very difficult. This is particularly true with respect to diagnosing failures related to cache memories. This is because the caches may store a large amount of data and may be relatively complex, particularly when multiple processing cores share the cache.

Frequently, the primary debug tool available to developers is software simulation of the processor design. In a common scenario, the developer has a software simulation, or simulator, of the design, and the developer provides an initial state of the processor, including the cache, to the simulator. Given the initial processor state, the simulator executes a target program until the bug manifests. The developer is enabled to look back at the execution history by the simulator to determine when the error was made by the design and by what component of the design.

BRIEF SUMMARY

In one aspect the present invention provides a processor. The processor includes a plurality of processing cores and a cache memory shared by the plurality of processing cores. The cache memory comprises a size engine that receives a respective request from each of the plurality of processing cores to perform an operation associated with the cache memory. The size engine fuses the respective requests from two or more of the plurality of processing cores into a fused request. To perform the fused request the size engine performs a single instance of the operation and notifies each of the two or more of the plurality of processing cores that its respective request has been completed when the single instance of the operation is complete.

In another aspect, the present invention provides a method for operating a processor having a plurality of processing cores and a cache memory shared by the plurality of processing cores. The method includes receiving, by the cache memory, a respective request from each of the plurality of processing cores to perform an operation associated with the cache memory. The method also includes fusing the respective requests from two or more of the plurality of processing cores into a fused request. The method also includes performing the fused request by performing a single instance of the operation and notifying each of the two or more of the plurality of processing cores that its respective request has been completed when the single instance of the operation is complete.

In yet another aspect, the present invention provides a computer program product encoded in at least one non-transitory computer usable medium for use with a computing device, the computer program product comprising computer usable program code embodied in said medium for specifying a processor. The computer usable program code includes first program code for specifying a plurality of processing cores and second program code for specifying a cache memory shared by the plurality of processing cores, wherein the cache memory comprises a size engine that receives a respective request from each of the plurality of processing cores to perform an operation associated with the cache memory. The size engine fuses the respective requests from two or more of the plurality of processing cores into a fused request. To perform the fused request the size engine performs a single instance of the operation and notifies each of the two or more of the plurality of processing cores that its respective request has been completed when the single instance of the operation is complete.

BRIEF DESCRIPTION OF THE DRAWINGS

FIG. 10 is a flowchart illustrating in more detail the operation of the processor of FIG. 1 to write an entry of the LLC 106 to the bus at block 912 of FIG. 9 according to one embodiment.

FIG. 11 is a flowchart illustrating in more detail the operation of the processor of FIG. 1 to write an entry of the LLC 106 to the bus at block 912 of FIG. 9 according to an alternate embodiment.

DETAILED DESCRIPTION OF THE EMBODIMENTS

Embodiments are described herein in which a processor performs a diagnostic writeback operation in which a cache memory of the processor writes its all of its tags and cache line states out on a system bus without invalidating the cache line states. This operation may be helpful to debugging the processor, particularly the cache memory, and/or to improving performance thereof.

Figure 1:
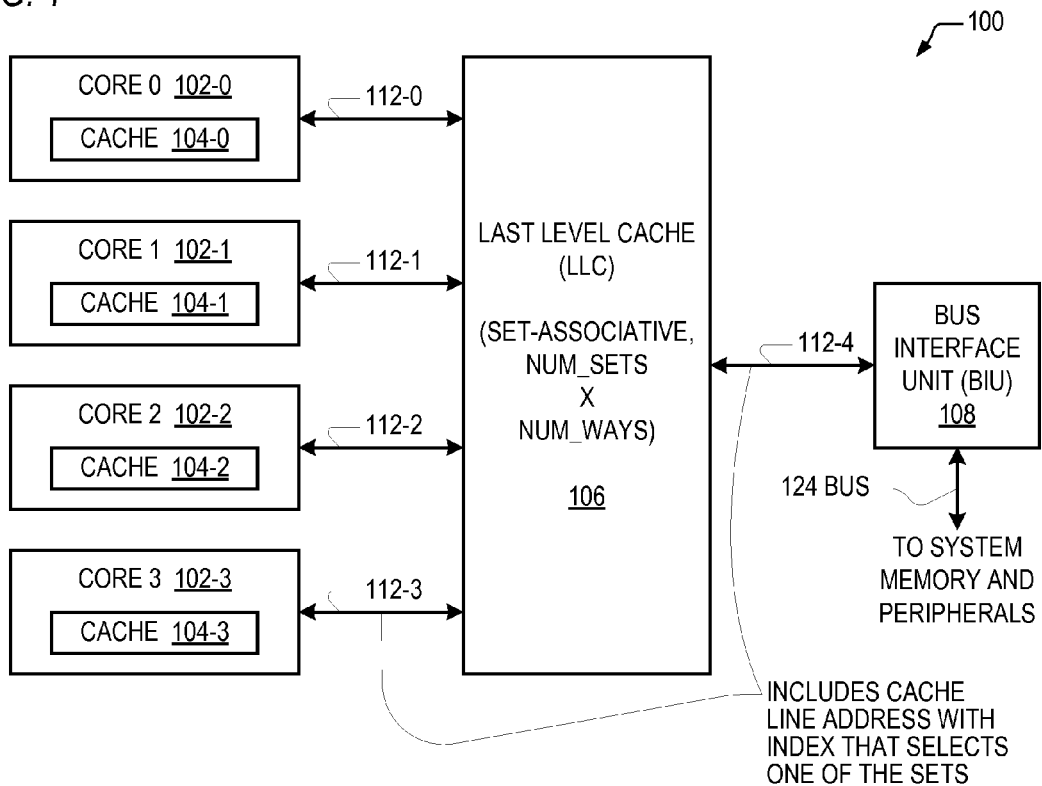
FIG. 1 is a block diagram illustrating a processor.

Referring now to FIG. 1, a block diagram illustrating a processor 100 is shown. In the embodiment of FIG. 1, the processor 100 is a multi-core processor having multiple processing cores 102, a bus interface unit (BIU) 108, and a shared last level cache (LLC) memory 106. In the example embodiment of FIG. 1, there are four cores 102 denoted core 0 102-0, core 1 102-1, core 2 102-2 and core 3 102-3, which are collectively referred to as cores 102 and generically individually referred to as core 102. Each of cores 102-0, 102-1, 102-2, 102-3 accesses the LLC 106 via a respective interface 112-0, 112-1, 112-2, 112-3, which are referred to collectively as interfaces 112 and generically individually as interface 112. The bus interface unit 108 also accesses the LLC 106 via an interface 112-4. The processor 100 is part of a larger computing system (not shown) that includes system memory and peripherals (also not shown), with which the LLC 106 communicates via the bus interface unit 108 over a system bus 124. Although the embodiment of FIG. 1 illustrates a processor 100 with four cores 102, other embodiments with different numbers of cores 102 are contemplated. All of the cores 102 share the LLC 106.

Each of cores 102-0, 102-1, 102-2, 102-3 includes its respective private cache memory hierarchy 104-0, 104-1, 104-2, 104-3, which are referred to collectively as private cache memory hierarchies 104 and generically individually as private cache memory hierarchy 104. Preferably, the cache memories of the private cache memory hierarchies 104 are smaller than the LLC 106 and have a relatively small access latency. In one embodiment, the private cache memory hierarchy 104 includes a level-1 (L1) instruction cache (L1I) and L1 data cache (L1D). The cores 102 also include functional units that may include, but are not limited to, an instruction fetch unit, branch prediction units, instruction decoders, instruction translators, microcode, architectural and non-architectural register sets, a rename unit, a reorder buffer, reservation stations, an instruction dispatcher and execution units, which may include integer units, floating point units, media units, branch units, load units and store units. Various microarchitectural features may be included in the cores 102, for example, the cores 102 may be superscalar or scalar and may execute instructions in-order or out-of-order. In one embodiment, the cores 102 conform substantially to the x86 instruction set architecture, although the cores 102 are not limited to a particular instruction set architecture, and may include other memory request agents such as a graphic processing unit (GPU) or field programmable gate array (FPGA).

The microcode of each core 102 includes debug routines, referred to herein as the tracer. The tracer can be invoked on each of the cores 102 in response to a variety of events, such as: (1) a core 102 is hung, i.e., the core 102 has fetched but not retired any instructions for a number of clock cycles that is programmable; (2) a core 102 loads data from an uncacheable region of memory; (3) a change in temperature of the processor 100 occurs; (4) the operating system requests a change in the processor's 100 bus clock ratio and/or requests a change in the processor's 100 voltage level; (5) the processor 100, of its own accord, changes the voltage level and/or bus clock ratio, e.g., to achieve power savings or performance improvement; (6) an internal timer of a core 102 expires; (7) a cache snoop that hits a modified cache line causing the cache line to be written back to memory occurs; (8) the temperature, voltage, or bus clock ratio of the processor 100 goes outside a respective range; (9) an external trigger signal is asserted by a user on an external pin of the processor 100; (10) an exception was taken; and (11) an internal error was detected. One manner of using the tracer is to invoke it at regular intervals, referred to as checkpoints. For example, a tracer checkpoint may be triggered every N clock cycles, where N is a relatively large number, such as 100,000. A logic analyzer coupled to the bus 124 is able to monitor activity on the bus 124 in between checkpoints and store the activity. When the checkpoint is triggered, tracer outputs a large amount of state of the processor 100 onto the bus 124. The logic analyzer also captures the state output on the bus 124 and saves it to a file. The processor 100 is then restarted. This process continues until the bug manifests.

The checkpoint method may be useful for finding many types of bugs, including cache bugs. One useful method is in conjunction with a software simulator. The initial state of the software simulator of the processor 100 is loaded with the processor 100 state saved by the logic analyzer at one of the checkpoints, such as the last checkpoint before the bug manifested. The simulator is then run until the bug manifests on the simulator, which may be useful in finding the bug.

According to a conventional method, a flag may be set that instructs the tracer to perform a writeback invalidate operation when outputting the processor 100 state. This forces the LLC 106 to a known state, i.e., all of the entries of the LLC 106 are invalidated. Correspondingly, the LLC 106 entries in the software simulator are invalidated so that its initial state matches that of the actual processor 100 when the processor is restarted after the checkpoint. However, a disadvantage of the conventional method is that the state of the LLC 106 is perturbed because all of its entries are invalidated, e.g., the MESI state is set to Invalid. This may be disadvantageous because it may cause the bug to take longer to manifest, if at all, particularly if the bug is in the cache.

Advantageously, the diagnostic writeback operation described herein does not invalidate the state of the cache lines of the LLC 106. Furthermore, the cache line state (e.g., the tag and MESI state) of all the LLC 106 entries is written to the bus 124 so that the logic analyzer can capture it for subsequent loading into the simulator as the initial state of the simulator LLC 106. Further advantageously, a size engine 506 (see FIG. 5) of the LLC 106 writes the LLC 106 state at bus 124 speed to minimize the checkpoint time.

It should be understood that, although embodiments are described in which the cache memory subject to the diagnostic writeback operation is a last-level cache, other embodiments are contemplated in which cache memories at other levels in the cache hierarchy of the processor 100 are subject to the diagnostic writeback operation. Additionally, although embodiments are described in which the processor 100 is a multi-core processor, other embodiments are contemplated in which one or more cache memories of a single core processor are subject to the diagnostic writeback operation.

Figure 2:
FIG. 2 is a block diagram illustrating portions of the system bus of FIG. 1.

Referring now to FIG. 2, a block diagram illustrating portions of the system bus 124 of FIG. 1 is shown. The bus 124 includes a data portion 202, and address portion 204 and a control portion 206. More specifically, the data portion 202 comprises a predetermined number of bits, the address portion 204 comprises a predetermined number of bits, and the control portion 206 comprises a predetermined number of bits. The bits may be embodied in a parallel bus fashion in which the bits are transmitted concurrently, in a serial fashion in which the bits are transmitted sequentially, or in a combination of the two. The control bits 206 specify the type of operation being performed on the bus, such as a read or write operation. The address bits 204 specify an address within the address space of the system. For example, in one embodiment, the number of address bits 204 is 36, which enables $2^{36}$ bytes, or 64 GB, of locations to be addressed. Generally, a device, such as a memory device or peripheral device having memory locations and/or control/status registers, is located at the address specified on the address bits 204, and the addressed device detects that it was addressed and responds, for example, to receive or provide data on the data bits 202. However, embodiments are described herein in which the address bits 204—or at least a portion of them—are used to convey metadata of the LLC 106, namely the tag 304 and state 306 of each cache line entry 300 (see FIG. 3) of the LLC 106, rather than to convey an address of a location in a device, in order to improve the ability to diagnose bugs in the processor 100. Alternate embodiments are described in which the data bits 202—or at least a portion of them—are used to convey the metadata 304/306 of the LLC 106, rather than to convey data destined for a device.

Figure 3:
FIG. 3 is a block diagram illustrating an entry of the last-level cache (LLC) of FIG. 1.

Referring now to FIG. 3, a block diagram illustrating an entry 300 of the LLC 106 of FIG. 1 is shown. Although the LLC 106 includes many entries, the entry 300 of FIG. 3 is representative. Each entry 300 includes data 302 of a cache line, a tag 304 of the cache line address, and a state 306 of the cache line. If the state 306 indicates the entry 300 is invalid, then the data 302 and tag 304 are invalid. In one embodiment, the state 306 is represented according to the well-known cache coherence protocol that allows the cache line to have a state of Modified, Exclusive, Shared or Invalid (MESI). However, other embodiments with different cache coherence protocols are contemplated. Preferably, the LLC 106 is inclusive of the private caches 104 of the cores 102 of the embodiment of FIG. 1, and the state 306 includes information related to the state of the respective cache line within the private caches 104. In one embodiment, each core 102 includes a L1 instruction cache and L1 data cache, and the MESI state 306 comprises 12 bits as follows. Bits [11:10] specify the MESI state of the LLC 106. Each of bits [7:0] is set if the corresponding L1 instruction/data cache of respective core 102 has a copy of the cache line and is clear otherwise. Bits [9:8] specify a global MESI state of the private caches 104. Thus, if none of the private caches 104 have the cache line, the global MESI state is Invalid; if one of the private caches allocated the cache line Exclusive, then the global MESI is Exclusive; otherwise, the global MESI state of the cache line is Shared.

An address is presented to the LLC 106 via the interfaces 112 of FIG. 1, and the LLC 106 looks up the address to determine whether the address hits in the LLC 106. The LLC 106 may be arranged as a direct cache, a set-associative cache or a fully associative cache. Preferably, the LLC 106 is arranged as a set-associative cache having NUM_SET sets and NUM_WAYS ways, as shown in the embodiment of FIG. 1. The LLC 106 is indexed by middle address bits (e.g., [16:6]) of the lookup address that select a set, and upper address bits (e.g., [35:17]) of the lookup address are compared with the tag 304 of each entry 300 of the NUM_WAYS ways in the selected set to determine whether a hit occurs. Advantageously, as described herein, the tag 304 and MESI state 306 of the entries 300 of the LLC 106 may be written to the bus 124 to facilitate debugging and/or performance tuning as described herein.

Figure 4:
FIG. 4 is a block diagram illustrating a set within the LLC of FIG. 1 according to a set-associative embodiment.

Referring now to FIG. 4, a block diagram illustrating a set 400 within the LLC 106 of FIG. 1 according to a set-associative embodiment is shown. Preferably, the LLC 106 includes many set, and the set 400 of FIG. 4 is representative. Each set 400 includes an entry 300 of FIG. 3 for each way of the LLC 106 and replacement policy bits 402. In one embodiment, the replacement policy is least-recently used (LRU); however, other embodiments are contemplated in which other replacement policies are used, such as pseudo-LRU, round-robin, random, and the like. In one embodiment, the NUM_WAYS is sixteen.

Figure 5:
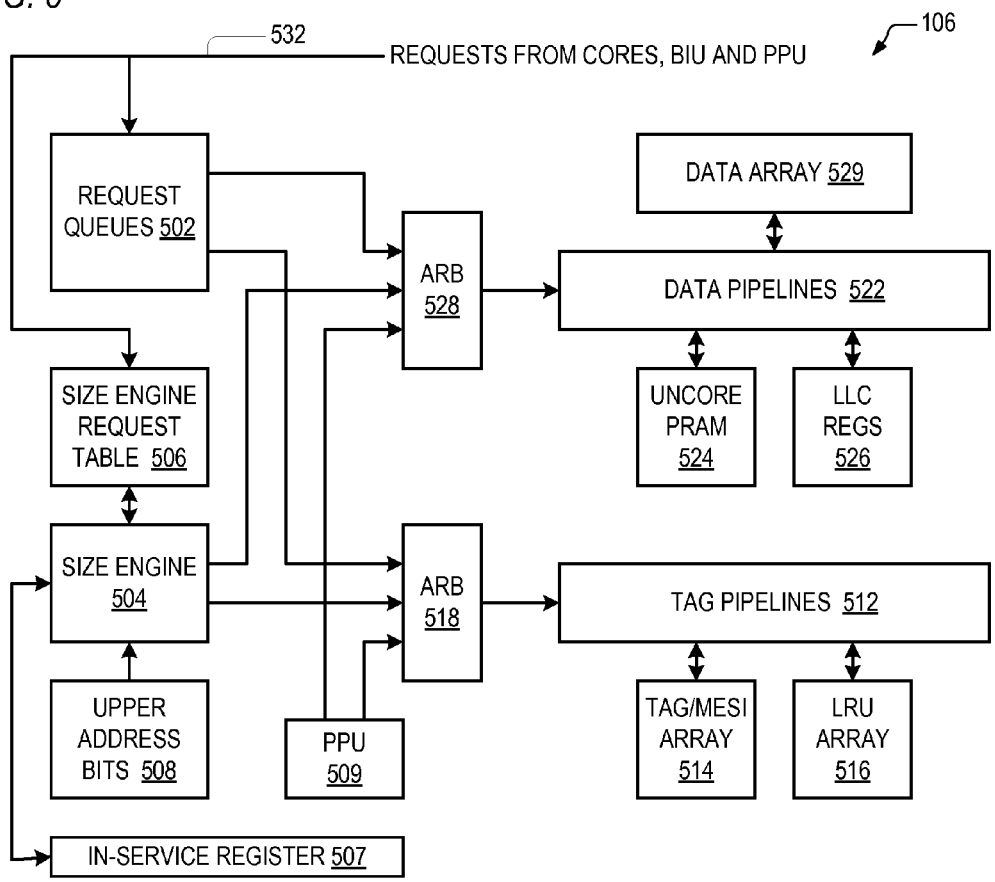
FIG. 5 is a block diagram illustrating in more detail the LLC of FIG. 1.

Referring now to FIG. 5, a block diagram illustrating in more detail the LLC 106 of FIG. 1 is shown. The LLC 106 includes request queues 502 that receive requests 532 to access the LLC 106 from the cores 102, the bus interface unit 108, and a service processor 509, referred to herein as a PPU 509.

The PPU 509 is employed for debug, performance monitoring and enhancing, and dynamic bug resolution. The PPU 509 has access to the LLC registers 526 and to the uncore PRAM 524, as well as to the tag array 514 and LRU array 516. The PPU 509 comprises a stored program processor that is an adjunct to and distinct from each of the cores 102. Although the cores 102 are architecturally visible to execute instructions of the ISA of the cores 102 (e.g., x86 ISA instructions), the PPU 509 is not architecturally visible to do so. So, for example, the operating system cannot run on the PPU 509 nor can the operating system schedule programs of the ISA of the cores 102 (e.g., x86 ISA instructions) to run on the PPU 509. Stated alternatively, the PPU 509 is not a system resource managed by the operating system. Rather, the PPU 509 performs operations used to debug the processor 100, including the LLC 106. Additionally, the PPU 509 may assist in measuring performance of the cores 102, as well as other functions. Preferably, the PPU 509 is much smaller, less complex and less power consuming (e.g., in one embodiment, the PPU 509 includes built-in clock gating) than the cores 102. In one embodiment, the PPU 509 comprises a FORTH CPU core.

The LLC 106 also includes a size engine 504. The size engine 504 receives requests from the request queues 502. The size engine 504 is also coupled to an in-service register 507, whose use is described in more detail below. The size engine 504 also receives upper address bits from an upper address bits register 508 and accesses a size engine request table 506, which is described in more detail below with respect to FIG. 6. Preferably, the default value of the upper address bits register 508 is configurable, such as by blowing fuses of the processor 100. Preferably, the upper address bits register 508 is also programmable to override the default value, such as by microcode of the processor 100, preferably in response to an architectural instruction, such as an x86 instruction set architecture write model specific register (WRMSR) instruction, or by the PPU 509. In one embodiment, the upper address bits register 508 is four bits wide and holds a value for presentation on the upper four bits of the bus 124 address bits 204 during a diagnostic writeback operation. The size engine 504 performs diagnostic writeback operations as described in more detail below.

The following is an example of how the upper address bit register 508 may be employed. The system is configured with 8 GB of system memory, and the operating system is instructed that only 4 GB of system memory is available (e.g., via BIOS), which results in the region of memory above 4 GB to be non-cacheable memory space. The upper address bit register 508 contains a value of 0x1 (either by default or by programming), which points to the region of system memory between 4 GB and 8 GB. When a diagnostic writeback operation is performed, the metadata 304/306 of the LLC 106 is written to locations between the 4 GB and 8 GB region of memory, which does not affect the system memory used by the operating system (i.e., below 4 GB), but which enables a logic analyzer looking at the bus 124 to capture the LLC 106 metadata 304/306 for debugging purposes, such as for provision to a software simulator of the processor 100 to reproduce the bug or use in performance analysis.

The LLC 106 includes a data array 529 that holds the cache line data 302 for the entries 300 of FIG. 3. The LLC 106 also includes a tag/MESI array 514 (or simply tag array 514) that holds the tags 304 and MESI state 306 of the entries of FIG. 300. The tag array 514 maintains data coherence between the cores 102 that share the LLC 106. The LLC 106 also includes an LRU array 516 (or more generally, replacement information array 516) that holds the LRU bits 404 of the sets of FIG. 400. The LLC 106 also includes an uncore private random access memory (PRAM) 524 and control/status registers 526 that configure aspects of operation and report status of the LLC 106. The uncore PRAM 524 is shared by the cores 102 and may be employed to perform inter-core communication and serve as private scratch pad space for microcode of the cores 102, among other things.

The LLC 106 also includes data pipelines 522 and the tag pipelines 512. The data pipelines 522 access the data array 529, uncore PRAM 524 and LLC registers 526 to read and/or update them. The data pipelines 522 retrieve data 302 from the data array 529, uncore PRAM 524 and LLC registers 526 and provide the data to the cores 102 and bus interface unit 108. The data pipelines 522 also receive data from requests (from request queues 502 and size engine 504 described below) and write the data to the data array 529, uncore PRAM 524 and LLC registers 526. The tag pipelines 512 access the tag array 514 and LRU array 516 to read and/or update them. The tag pipelines 512 generate responses, or actions, that are used to update the requests in the request queues 502 and size engine 504. The requests may also update the MESI state 306 in the tag array 514 and may indirectly update the LRU bits 404 in the LRU array 516. In one embodiment, the LLC 106 includes two data pipelines 522 and two tag pipelines 512.

Arbitration logic 528 arbitrates requests for access to the data pipelines 522 from the request queues 502 and size engine 504. Similarly, arbitration logic 518 arbitrates requests for access to the tag pipelines 512 from the request queues 502 and size engine 504.

Preferably, the engine 504 is capable of using the entire bandwidth of the bus 124. This enables the diagnostic writeback operation to be performed relatively quickly with respect to conventional methods. Additionally, unlike a conventional writeback invalidate operation (e.g., x86 WBINVD instruction), the diagnostic writeback operation does not invalidate the MESI state 306 of the entries 300 of the LLC 106. One or both of these two characteristics of the diagnostic writeback operation may advantageously cause the bug to manifest more quickly, which may advantageously enable the bug to be found and fixed sooner than using conventional methods. Preferably, the size engine 504 comprises two state machines that perform the diagnostic writeback operation. It should be understood that although a debugging methodology using a simulator is described, the diagnostic writeback operation may be used to debug according to other methodologies. For example, the debugger/engineer may simply examine the diagnostic writeback operation output, e.g., by simply looking at the output of the diagnostic writeback operation and/or analyzing the output via software running on a computer. This may be particularly the case where the cache line data is not needed to discover the bug, but it is the cache line state that is needed, such as according to the embodiment of FIG. 11.

Figure 6:
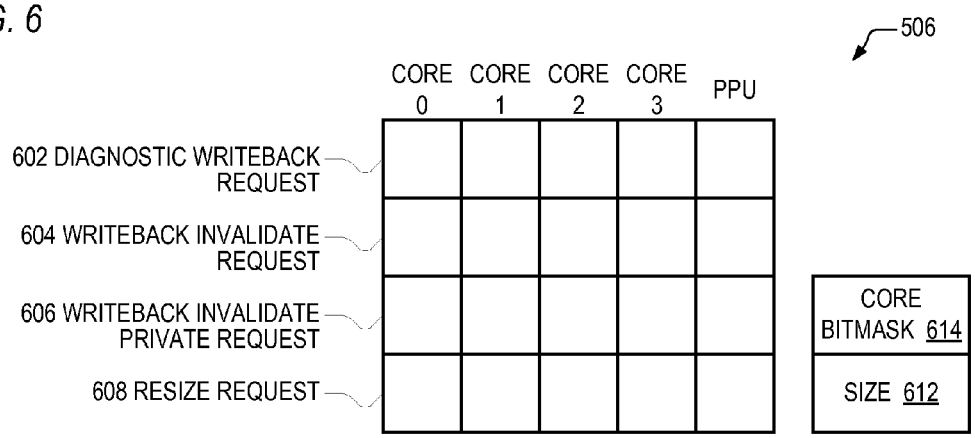
FIG. 6 is a block diagram illustrating the size engine request table of FIG. 5.

Referring now to FIG. 6, a block diagram illustrating the size engine request table 506 of FIG. 5 is shown. The size engine request table 506 includes a row of bits for each of a plurality of types of cache management requests, also referred to as size engine requests or simply requests, that may be received from the cores 102 and the PPU 509. In the embodiment of FIG. 6, the types of size engine requests are: diagnostic writeback request 602, writeback invalidate request 604, writeback invalidate private request 606, and resize request 608. The size engine request table 506 also includes a size field 612 associated with the resize request 608 and a core bitmask field 614 associated with the writeback invalidate private request 606. The core bitmask field 614 includes a bit corresponding to each of the cores 102. The size engine 504 performs a diagnostic writeback operation as described herein in response to a diagnostic writeback request 602.

For a writeback invalidate request type 604, the size engine 504 performs a writeback invalidate operation in which the size engine 504 writes back modified cache lines of the LLC 106 to system memory and invalidates all the entries 300 of the LLC 106. In one embodiment, the size engine 504, before writing back modified cache lines to system memory and invalidating the LLC 106 cache lines, first snoops out all valid cache lines from the private caches 104 into the LLC 106 and leaving all entries of the private cache 104 invalid. In one embodiment, the size engine 504 visits the entries of the LLC 106 in a way/set order similar to the order described with respect to the diagnostic writeback operation described with respect to FIG. 9 and Table 1 below to perform the writeback invalidate operation.

Each writeback invalidate private request 606 made by a core 102 or PPU 509 includes a bitmask that includes a bit corresponding to each of the cores 102. As described below with respect to block 1208 of FIG. 12, when the core 102 or PPU 509 makes a writeback invalidate private request 606, the size engine 504 merges (i.e., Boolean OR's) the value of the bitmask into the current value of the core bitmask 614 of the size engine request table 506. For a writeback invalidate private request type 606, the size engine 504 performs a writeback invalidate private operation in which the size engine 504 examines the bits in the core bitmask 614 to determine which of the cores 102 have their bits set. For each core 102 having its bit set in the core bitmask 614, the size engine 504 snoops out all valid cache lines from the private caches 104 of the specified cores 102 into the LLC 106 and leaves the private caches 104 of the cores 102 specified in the core bitmask 614 invalid. Consequently, when the writeback invalidate private request 606 is complete, the LLC 106 reflects the most up-to-date version of the cacheable data in the processor with respect to the cores 102 specified in the core bitmask 614. In one embodiment, the size engine 504 visits the entries of the LLC 106 in a way/set order similar to the order described with respect to the diagnostic writeback operation described with respect to FIG. 9 and Table 1 below to perform the writeback invalidate private operation.

Each resize request 608 from a core 102 or PPU 509 specifies a size, which is a number of ways of the LLC 106. For a resize request 608, the size engine 504 performs a resize operation in which the size engine 504 resizes the LLC 106 to the number of ways specified in the size field 612. That is, the size engine 504 disables Q ways of the LLC 106, where Q equals the NUM_WAYS minus the size 612 specified in the size engine request table 506. Preferably, the size engine 504 disables the Q ways by removing their clocks and/or removing their power, in order to save power consumption by the processor 100. In the case in which the size 612 is greater than the number of currently enabled ways, then the size engine 504 enables disabled ways, e.g., by enabling their power and their clocks. Preferably, the size engine 504 disables the Q ways in the order specified in block 902 of FIG. 9 and Table 1 below and enables ways in reverse order.

For each type of request, the size engine request table 506 includes a bit associated with each of the cores 102 and the PPU 509 that is set if there is an outstanding size engine request from the core 102/PPU 509 for the respective size engine request type and is otherwise cleared. Advantageously, the size engine request table 506 helps facilitate fusing of size engine requests of each of the four types as follows. If a size engine request of a particular type is pending—as indicated by one or more set bits in the row of the size engine request table 506 associated with the operation type—when another core 102/PPU 509 makes the same type of size engine request, then the associated requestor's bit is simply set in the size engine request table 506. Eventually, the size engine 504 begins arbitrating constituent requests into the tag pipelines 512 and data pipelines 522 to perform the size engine request indicated in the table 506. However, advantageously, because of the nature of the size engine requests, when the size engine 504 has finished performing the requested operation, the size engine 504 clears all of the bits in the row of the size engine request type. In one embodiment, the size engine 504 primarily arbitrates constituent requests into the tag pipelines 512 and, in response to the tag pipeline 512 actions, pushes requests into the request queues 502 (e.g., into a fill queue and/or query queue) that arbitrate into the into the data pipeline 522.

Thus, for example, if a core 102 requests a writeback invalidate 604 and another core 102 or cores 102 request a writeback invalidate 604 before the first request is initiated, then the size engine 504 will perform a single writeback invalidate operation, which satisfies all of the cores 102 that made a request writeback invalidate 604. In the case of a resize request 608, the last size requested is stored in the size field 612 and used by the size engine 504 to perform the fused resize request 608. In the case in which the size engine 504 fuses writeback invalidate private requests 606 by multiple cores 102, the size engine 504 advantageously makes a single pass through the LLC 106 (i.e., looking at the MESI state 306 of each entry 300, which includes MESI state associated with each of the private caches 104) and snoops out cache lines of each core 102 whose writeback invalidate private request 606 bit was set. This is advantageous over an embodiment in which the size engine 504 serially makes multiple passes through the LLC 106, i.e., a different pass associated with each core 102 that had its writeback invalidate private request 606 bit set.

The size engine request fusing, which is described in more detail below with respect to FIGS. 12 through 15, may be particularly advantageous for multiple reasons. First, it may increase performance of the processor 100 because the cache management requests typically take a relatively very long time to complete, and the fusing may reduce the aggregate time taken to complete multiple cache management requests by performing a single cache management operation to satisfy multiple cache management requests. Advantageously, the fusing is performed transparently to the cores 102. That is, a core 102 is not aware that its cache management request was fused with another core 102. Second, it may simplify the microcode that makes the cache management requests, in particular, it may reduce the complexity associated with inter-core 102 communication.

Diagnostic Writeback

Figure 7:
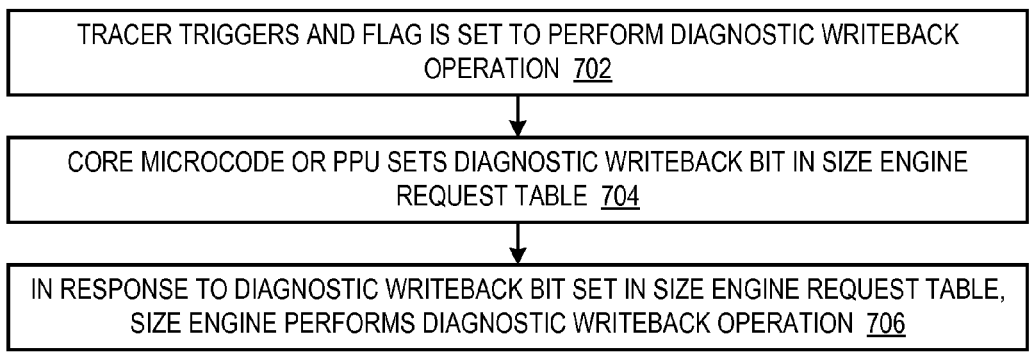
FIG. 7 is a flowchart illustrating operation of the processor of FIG. 1.

Referring now to FIG. 7, a flowchart illustrating operation of the processor 100 of FIG. 1 is shown. Flow begins at block 702.

At block 702, a triggering event occurs that invokes the tracer microcode on one of the cores 102. The microcode detects that the flag is set that directs tracer to perform a diagnostic writeback operation. Flow proceeds to block 704.

At block 704, the microcode writes to a control register to set its diagnostic writeback request 602 bit in the size engine request table 506. Alternatively, the PPU 509 writes to the control register to set its diagnostic writeback request 602 bit in response to an event that occurred that invokes the PPU 509 to request a diagnostic writeback operation. Flow proceeds to block 706.

Figure 9:
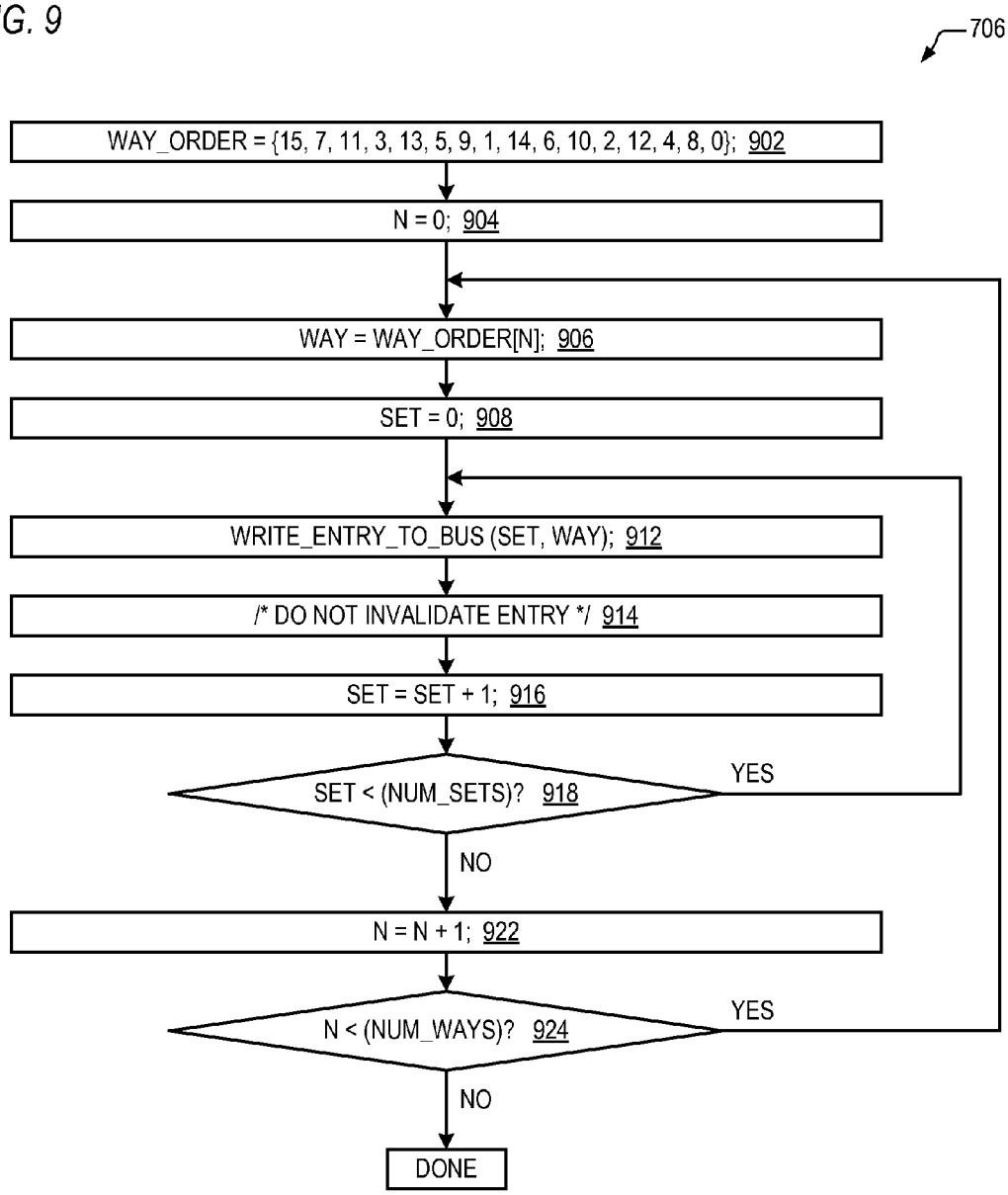
FIG. 9 is a flowchart illustrating in more detail the operation of the processor of FIG. 1 to perform the diagnostic writeback operation of block 706 of FIGS. 7 and 8.

At block 706, the size engine 504 detects that one or more of the diagnostic writeback request 602 bits is set and, in response, performs a diagnostic writeback operation, which is described in more detail with respect to FIG. 9. The size engine 504 clears all diagnostic writeback request 602 bits when it commences the diagnostic writeback operation. Flow ends at block 706.

Figure 8:
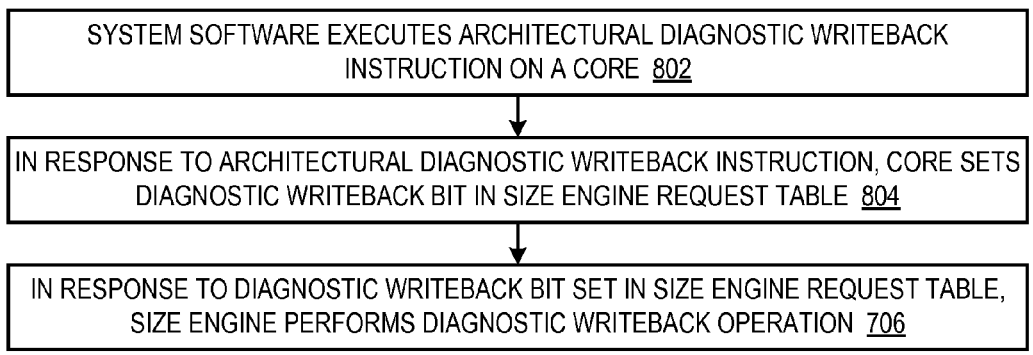
FIG. 8 is a flowchart illustrating operation of the processor of FIG. 1 according to an alternate embodiment.

Referring now to FIG. 8, a flowchart illustrating operation of the processor 100 of FIG. 1 according to an alternate embodiment is shown. Flow begins at block 802.

At block 802, one of the cores 102 executes a diagnostic writeback instruction. Preferably, the diagnostic writeback instruction is an architectural instruction, i.e., is an instruction in the instruction set architecture of the processor 100 that may be executed by system software, such as the operating system. In one example, the system software may execute the architectural diagnostic writeback instruction at the request of an optimizing compiler in order to obtain the metadata 304/306 of the LLC 106 for the purpose of optimizing performance for a program. In another example, a software diagnostic program may execute the architectural diagnostic writeback instruction to diagnose whether the LLC 106 is working properly. In another example, the system software may execute the architectural diagnostic writeback instruction for debugging purposes. Preferably, the diagnostic writeback instruction includes a parameter that specifies a value to be written to the upper address bits register 508 prior to commencement of the diagnostic writeback operation. Flow proceeds to block 804.

At block 804, the core 102 writes to a control register to set its diagnostic writeback request 602 bit in the size engine request table 506. Flow proceeds to block 706 where the size engine 504 performs a diagnostic writeback operation as described with respect to FIG. 7. Flow ends at block 706.

Referring now to FIG. 9, a flowchart illustrating in more detail the operation of the processor 100 of FIG. 1 to perform the diagnostic writeback operation of block 706 of FIGS. 7 and 8 is shown. Flow begins at block 902.

At block 902, a static array, denoted "way_order[ ]," is initialized with the predetermined order in which the ways within a set of the LLC 106 are written out to the bus 124. The pseudocode below in Table 1 specifies the order for one embodiment having 16 ways. However, other predetermined orders are contemplated. The embodiment shown below corresponds to the order in which ways are shutdown when a resize request 608 of the LLC 106 is performed. In one embodiment, the order is predetermined based on the configuration of the LRU bits 402. Flow proceeds to block 904.

At block 904, a variable, denoted "N," is initialized to zero. The value of the variable N is used to index into the static array way_order[ ] below (block 906). In one embodiment, if some of the ways of the LLC 106 are disabled (e.g., due to a previously performed resize request 608), then N is set to the number of ways that are disabled. For example, if four ways are disabled (which would be ways 15, 7, 11 and 3 in the embodiment of FIG. 9), then those ways would not be visited and would not have their entries written to the bus. Preferably, the number of enabled ways of the LLC 106 is held in a control register of the LLC 106 whose value is written to the bus 124, which enables the debugger to know how many entries 300 of the LLC 106 will be written to the bus 124 during the diagnostic writeback operation. Flow proceeds to block 906.

At block 906, a variable, denoted "way," is assigned the value at way_order[N]. The value of the variable way is used to determine which way within the current set will currently have its entry 300 written to the bus 124. Flow proceeds to block 908.

At block 908, a variable, denoted "set," is initialized to zero. The value of the variable set is used to determine which set of the LLC 106 will currently have its entries 300 written to the bus 124. Flow proceeds to block 912.

At block 912, the metadata 304/306 associated with the entry 300 specified by the current value of the variables set and way is written to the bus 124, as described in more detail with respect to the embodiments of FIGS. 10 and 11, for example. Flow proceeds to block 914.

At block 914, it is noted that the size engine 504 does not invalidate the entry 300 that is written to the bus 124 at block 912. By not invalidating the MESI state 306 of the entry 300, the diagnostic writeback operation advantageously potentially facilitates faster manifestation of the bug, as described herein. Flow proceeds to block 916.

At block 916, the value of the variable set is incremented. Flow proceeds to decision block 918.

At decision block 918, a determination is made whether the value of the variable set is less than NUM_SETS−1. If so, flow returns to block 912 to write out the next entry 300 of the current way; otherwise, flow proceeds to block 922.

At block 922, the value of the variable N is incremented. Flow proceeds to decision block 924.

At decision block 924, a determination is made whether the value of the variable N is less than NUM_WAYS−1. If so, flow returns to block 906 to write out the next way worth of entries 300; otherwise, flow ends.

The pseudo-code in Table 1 below is an alternate representation of the operation performed according to FIG. 9. It should be noted that although the flowchart of FIG. 9 and the pseudo-code below are intended to convey one embodiment of the general actions performed by the size engine 504 to accomplish a diagnostic writeback operation, the size engine 504 finite state machines may be configured according to other embodiments. For example, although it is illustrative to employ variables such as way_order, set, N or way, the size engine 504 state machines may not actually employ such variables, yet it accomplishes the overall effect of writing the metadata 304/306 to the bus 124 in the predetermined order of the entries 300 described. In one embodiment in which there are two tag pipelines 512, one of the tag pipelines 512 performs the operation of the pseudocode below for the even-numbered sets and concurrently the other one of the tag pipelines 512 performs the operation for the odd-numbered sets.

TABLE 1

```
way_order[ ] = {15,7,11,3,13,5,9,1,14,6,10,2,12,4,8,0};
for (n = 0; n < NUM_WAYS; n++)
{
    way = way_order[n];
    for (set = 0; set < NUM_SETS; set++)
    {
        write_entry_to_bus (set, way);
    }
}
```

As may be observed from FIG. 9 and the pseudo-code of Table 1, advantageously, the index of each entry 300 may be unambiguously inferred from the order in which the information is provided on the bus 124 during the diagnostic writeback operation, which enables the debugger to unambiguously determine the address of the cache line of the entry 300 by reconstructing it using the index and the tag 304. More specifically, assume J is a zero-based representation of the order in which a given entry 300 is written at block 912 on the bus 124 during a diagnostic writeback operation, i.e., J is zero for the first entry 300, J is one for the second entry 300, and so forth up to J=(NUM_SETS*NUM_WAYS)−1. Then, the debugger knows the index for a given entry 300 whose metadata 304/306 is written on the bus is J modulo NUM_WAYS. Additionally, advantageously, the way of each entry 300 of the LLC 106 from which each metadata 304/306 written on the bus at block 912 may be unambiguously inferred from the order in which the information is written on the bus 124 during the diagnostic writeback operation and the predetermined way_order[ ]. More specifically, the first NUM_SETS number of metadata 304/306 written on the bus 124 are from way 15; the second NUM_SETS number of metadata 304/306 written on the bus 124 are from way 7; the third NUM_SETS number of metadata 304/306 written on the bus 124 are from way 11; and so forth.

In one embodiment, a writeback invalidate private request 606 that specifies all the cores 102 is performed prior to the diagnostic writeback request 602 in order to snoop out all modified cache line data into the LLC 106 so that the most up-to-date cache line data (according to the embodiment of FIG. 10) is captured on the bus 124. This may be helpful for loading the most up-to-date cache line data into the LLC 106 of the simulator. It is noted that this leaves the private caches 104 invalidated (consequently the simulator is loaded with the private caches 104 being invalidated). This may perturb the bug occurrence; however, there may be some bugs that are more reproducible in this manner than by performing a conventional writeback invalidate request 604. Alternatively, in order to determine modified data in the private caches 104, a first diagnostic writeback request 602 is performed and a first set of the cache line data and metadata 304/306 is captured, then a writeback invalidate private request 606 specifying all the cores 102 is performed, then a second diagnostic writeback request 602 is performed and a second set of the cache line data and metadata 304/306 is captured. The debugger then compares the first and second sets of cache line data and metadata 304/306 to determine which cache lines in the private caches 104 had modified data and their data values.

In one embodiment, the size engine 504 is also capable of receiving from the cores 102/PPU 509 a diagnostic writeback private request. In one embodiment, to perform a diagnostic writeback private operation, the size engine 504 snoops the private caches 104 shared-OK; that is, the private caches 104 give up the data of modified cache lines to the LLC 106, but keep the cache lines in a shared state, rather than invalidating the cache line. In this case, the most up-to-date cache line data appears on the bus 124 during the diagnostic writeback operation; however, advantageously, the amount of perturbation of the private caches 104 and LLC 106 is minimized, and both the LLC 106 and the private caches 104 of the simulator may be loaded with cache line data values that match those of the hardware processor 100. In an alternate embodiment, the size engine 504 snoops the private caches 104 exclusive-OK; that is, the private caches 104 give up the data of modified cache lines to the LLC 106, but keep the cache lines in an exclusive state, rather than invalidating the cache line. In this case, the amount of perturbation is even less because when the private cache 104 wants to subsequently modify the cache line it may do so without having to obtain exclusive ownership of the cache line before modifying it.

Referring now to FIG. 10, a flowchart illustrating in more detail the operation of the processor 100 of FIG. 1 to write an entry 300 of the LLC 106 to the bus 124 at block 912 of FIG. 9 according to one embodiment is shown. At block 1002, the size engine 504 sends a request to the bus interface unit 108 to perform a transaction on the bus 124 with respect to an entry 300 of the LLC 106. The request provides the data 302 of the entry 300 for provision on the data bits 202 of the bus 124.

The request provides the value of the upper address bits register 508 on the corresponding upper bits of the address bits 204 of the bus 124. In one embodiment, these are bits [35:32]. The request also provides the tag 304 and MESI state 306 of the entry 300 on address bits 204 of the bus 124 other than those on which the upper address bits 508 are provided. In one embodiment, the tag 304 is provided on bits [33:15] and the MESI state 306 is provided on bits [13:3].

In one embodiment, the request also provides on one of the other address bits 204 a bit that indicates which of the two tag pipelines 512 handled the entry 300. In one embodiment, this is bit [14]. In one embodiment, one of the tag pipelines 512 handles entries 300 of even-numbered sets of the LLC 106, and the other tag pipeline 512 handles entries 300 of the odd-numbered sets such that the tag pipeline 512 may be unambiguously inferred from the predetermined order in which the entries 300 are written on the bus 124 during the diagnostic writeback operation.

In one embodiment, the MESI state 306 is provided in a compressed 11-bit form as follows. The MESI state 306 held in the entry 300 is a 12-bit structure, which is described above with respect to FIG. 3, but which is reiterated here:
[11:10]=LLC_MESI (M, E, S or I)
[9:8]=Global_L1_MESI (E, S or I)
[7:0]=L1_Bitmap (core0 L1D, core0 L1I, core1 L1D, core1 L1I, core2 L1D, core2 L1I, core3 L1D, core3 L1I)

Bit 8 is logically redundant, so it is removed to produce an 11-bit compressed value. Bit 8 is logically redundant because it is never valid to have bits 8 and 9 both set because that would imply a Modified cache line in one of the L1 caches 104, which is a state the LLC 106 does not maintain in the Global_L1_MESI bits. Additionally, bit 8 can only be set if one or more of bits [7:0] is set. Therefore, from the 11 bits written on the bus 124, the debugger is able to reconstruct bit 8 of the original MESI state 306 as follows:
Global_L1_MESI[0]=~Global_L1_MESI[1] & (L1_Bitmap[7:0] !=0)

It should be understood from the equation above that Global_L1_MESI[0] corresponds to bit 8 of the MESI state 306 of the entry 300 and Global_L1_MESI[1] corresponds to bit 9 of the MESI state 306 of the entry 300.

In one embodiment, the LRU bits 402 are also provided on the bus 124 address bits 204. In one embodiment, the number of LRU bits 402 is fifteen, and a different one of the fifteen LRU bits 402 is provided on one of the other address bits 202 for each of the sixteen ways of the set but one, which enables the debugger to construct the fifteen bits of the LRU 402 from the entries 300 written to the bus 124 for a given set, which is unambiguously determinable from the predetermined order in which the entries 300 are written on the bus 124, as described above.

Referring now to FIG. 11, a flowchart illustrating in more detail the operation of the processor 100 of FIG. 1 to write an entry 300 of the LLC 106 to the bus 124 at block 912 of FIG. 9 according to an alternate embodiment is shown. At block 1102, the size engine 504 sends a request to the bus interface unit 108 to perform a transaction on the bus 124 with respect to an entry 300 of the LLC 106. The request provides the tag 304 and MESI state 306 of the entry 300 for provision on the data bits 202 of the bus 124. In one embodiment, a portion of the data 302 of the entry 300 is also written on bits of the bus 124 data bits 202 that are not used to write the tag 304 and MESI state 306. It is observed that most cache-related bugs are unaffected by the actual data 302 stored in the entries 300 of the LLC 106. This embodiment recognizes that fact and employs it to potential advantage.

The request provides the value of the upper address bits register 508 on the corresponding upper bits of the bus 124 address bits 204. In one embodiment, the lower address bits 204 (i.e., the address bits 204 not corresponding to the upper address bits 508) are initialized to zero (or some other predetermined value) for the first entry to be written to the bus 124, and are incremented each time an entry 300 is written on the bus 124 by the diagnostic writeback operation. In this fashion, if the location to which the diagnostic writeback operation is performed (i.e., the range of addresses to which the diagnostic writeback operation writes on the bus 124) is backed by system memory that is not used by the operating system for normal operations (e.g., not allocated to programs running under the supervision of the operating system), then the metadata 304/306 may be stored to this region of system memory for later retrieval and analysis by the system software.

An advantage of embodiments described in the present disclosure is that the diagnostic writeback operation does not cause the information in the cache memory to be lost like it is with a conventional writeback and invalidate operation. This is advantageous because it may take a long time to re-populate the cache via normal program loads and stores and prefetches after the invalidation, which may significantly lengthen the amount of simulation time. More specifically, the simulator may spend most of its time simply re-populating the cache, particularly for a large cache such as a last level cache (LLC), to enable the bug to manifest itself.

Size Engine Request Fusing

Figure 12:
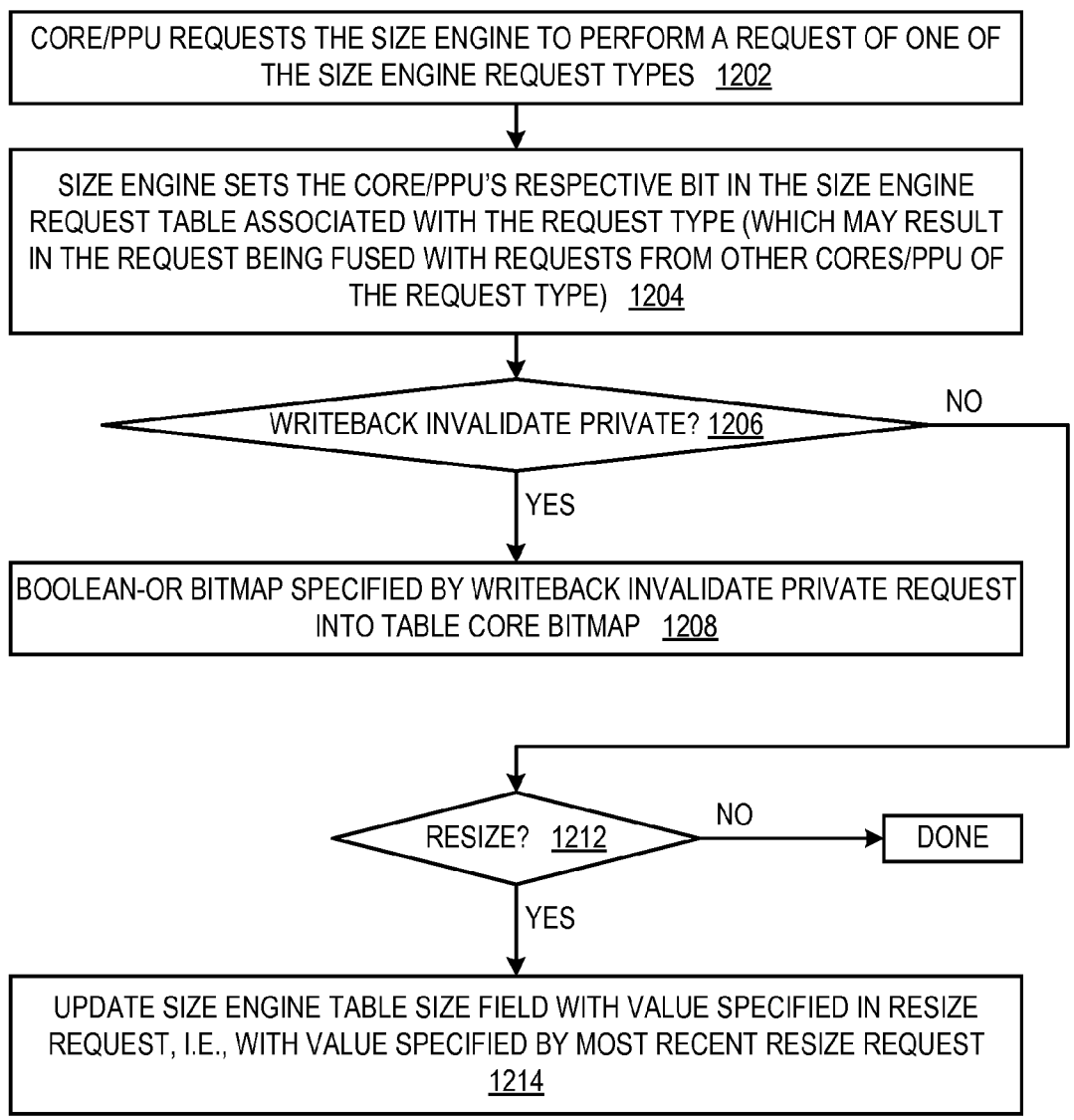
FIG. 12 is a flowchart illustrating operation of the processor of FIG. 1 to receive a request from a core/PPU and potentially fuse the request with requests from other of the cores/PPU.

Referring now to FIG. 12, a flowchart illustrating operation of the processor 100 of FIG. 1 to receive a request from a core/PPU 102/509 and potentially fuse the request with requests from other of the cores/PPU 102/509 is shown. Flow begins at block 1202.

At block 1202, a core 102 or the PPU 509 sends a request to the size engine 504 to perform a request. The request is one of the request types supported by the size engine 504, e.g., diagnostic writeback request 602, writeback invalidate request 604, writeback invalidate private request 606, or resize request 608. Flow proceeds to block 1204.

At block 1204, the size engine 504 sets the bit in the size engine request table 506 associated with the request type 602/604/606/608 specified in the request and associated with the requesting core 102 or PPU 509. This may result in the request being fused with one or more requests of the same request type made by another core/PPU 102/509. More specifically, if the bit associated with more than one core/PPU 102/509 of a given request type 602/604/606/608 is set when the size engine 504 becomes idle, i.e., when no request is in-service (as determined at block 1302 of FIG. 13), then the size engine 504 will advantageously perform a single instance of the operation associated with the request type 602/604/606/608 and notify all the cores/PPU 102/509 whose bits were set that its respective request completed when the operation completes (per blocks 1312 and 1314 of FIG. 13). Flow proceeds to decision block 1206.

At decision block 1206, the size engine 504 determines whether the request is a writeback invalidate private request 606. If so, flow proceeds to block 1208; otherwise, flow proceeds to decision block 1212.

At block 1208, the size engine 504 Boolean-ORs the core bitmap value specified in the writeback invalidate private request 606 with the current value in the core bitmap register 614. Flow ends at block 1208.

At decision block 1212, the size engine 504 determines whether the request is a resize request 608. If so, flow proceeds to block 1214; otherwise, flow ends.

At block 1214, the size engine 504 updates the size register 612 with the size value specified in the resize request 608. Flow ends at block 1214.

Figure 13:
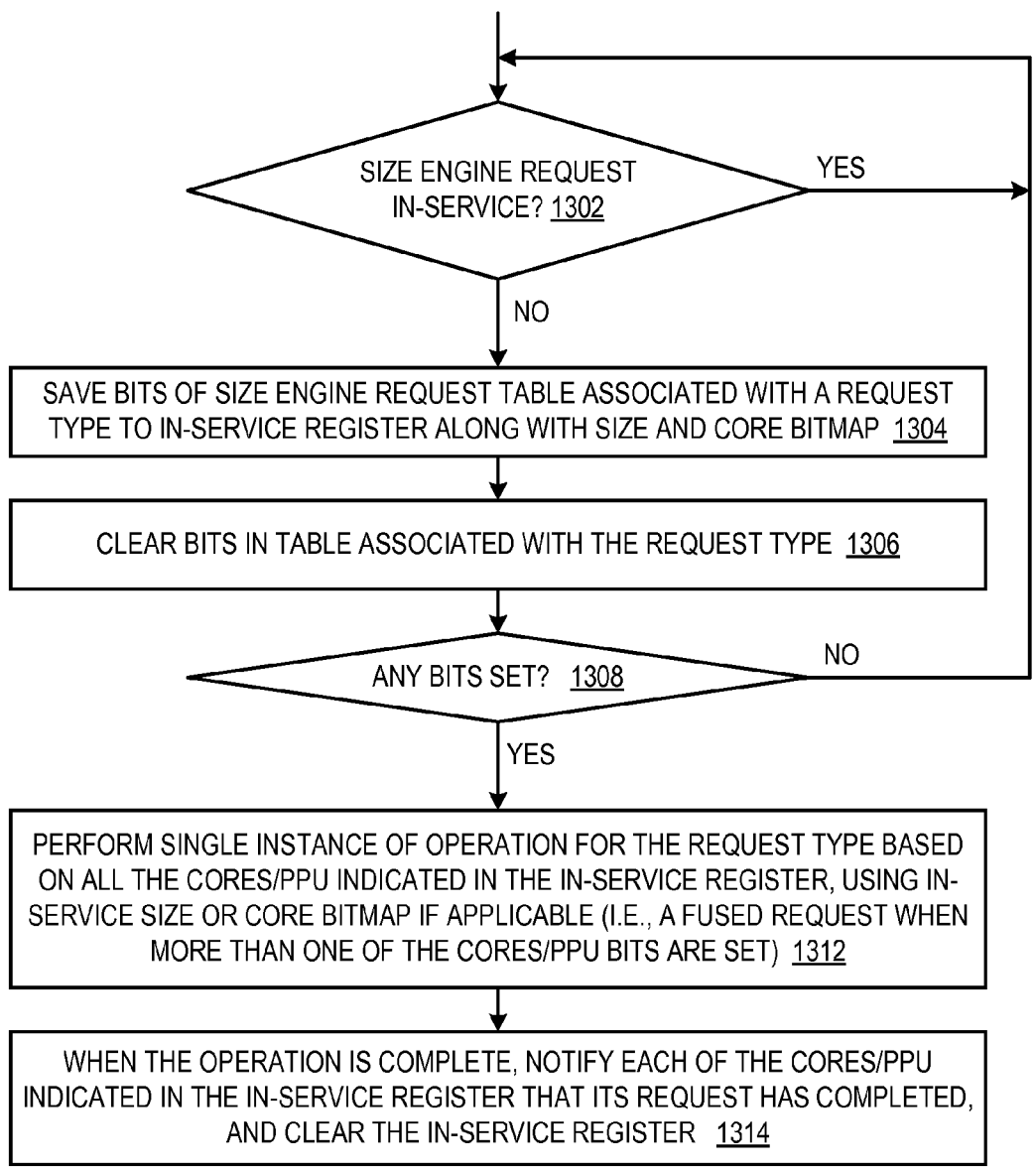
FIG. 13 is a flowchart illustrating operation of the processor of FIG. 1 to perform a size engine request, which may be a fused request.

Referring now to FIG. 13, a flowchart illustrating operation of the processor 100 of FIG. 1 to perform a size engine 504 request, which may be a fused request, is shown. Flow begins at decision block 1302.

At decision block 1302, the size engine 504 determines whether a request is currently in-service. That is, the size engine 504 determines whether it is currently performing an operation associated with the LLC 106 to fulfill a request 602/604/606/608 made by one or more core/PPU 102/509. In one embodiment, the size engine 504 determines whether a request is currently in-service by determining whether any of the bits in the in-service register 507 are set. If a request is currently in-service, flow returns to decision block 1302; otherwise, flow proceeds to block 1304.

At block 1304, the size engine 504 saves the bits of the size engine request table 506 associated with one of the request types 602/604/606/608 (e.g., one of the rows of bits of FIG. 6) to the in-service register 507 along with the current values of the size register 612 and the core bitmap 614. In one embodiment, the size engine 504 has a static priority among the four request types 602/604/606/608 that it uses to select which request type to service next. In an alternate embodiment, the size engine 504 selects in round-robin order among the four request types 602/604/606/608. Flow proceeds to block 1306.

At block 1306, the size engine 504 clears the bits in the size engine request table 506 associated with the request type 602/604/606/608 selected at block 1304. Additionally, the size engine 504 clears the core bitmask 614 and the size 612. Flow proceeds to decision block 1308.

At decision block 1308, the size engine 504 determines whether any of the core/PPU 102/509 bits in the in-service register 507 that were saved to it at block 1304 are set. That is, the size engine 504 determines whether any core/PPU 102/509 has a pending request of the selected request type 602/604/606/608. If not, flow returns to decision block 1302 to check for a pending request for the next request type 602/604/606/608. If so, flow proceeds to block 1312.

At block 1312, the size engine 504 performs a single instance of the operation for the selected request type 602/604/606/608 based on all the cores/PPU 102/509 indicated in the in-service register 507. In the case of a resize request 608 or writeback invalidate private request 606, the size engine 504 uses the current value of the size register 612 or the core bitmap 614, respectively, to perform the operation. More specifically, if more than one of the core/PPU 102/509 bits in the size engine request table 506 of the selected request type is set, then the individual requests will be merged into a fused request that will be satisfied by the single instance of the operation for the selected request type. For example, if core 1 102-1 and core 3 102-3 both have their writeback invalidate private request 606 bit set, then the size engine 504 will perform a single writeback invalidate private operation that snoops out the private caches 104 of both core 1 102-1 and core 3 102-3, rather than two writeback invalidate private operations. For another example, if core 0 102-0, core 1 102-1 and core 3 102-3 all have their writeback invalidate request 604 bit set, then the size engine 504 will perform a single writeback invalidate operation, rather than three writeback invalidate operations. For another example, if core 2 102-2 and core 3 102-3 both have their diagnostic writeback request 602 bit set, then the size engine 504 will perform a single diagnostic writeback operation, rather than two diagnostic writeback operations. For another example, if core 0 102-0 and core 3 102-3 both have their resize request 608 bit set, then the size engine 504 will perform a single resize operation that resizes the LLC 106 to the size specified in the size register 612 (i.e., the size specified by the last core 102 that issued its request to the size engine 504), rather than two resize operations. Flow proceeds to block 1314.

At block 1314, when the operation performed at block 1312 is complete, the size engine 504 notifies each core/PPU 102/509 indicated in the in-service register 507 that its request has completed. The size engine 504 also clears the in-service register 507. Flow ends at block 1314.

The following example illustrates a fusing of cache management requests and some of its benefits. As described above a writeback invalidate private operation is performed by iterating through each enabled set/way of the LLC 106 and finding cache lines that are valid in the cores 102 specified by the core bitmask 614, regardless of how many bits are set in the bitmask 614 (as long as that at least one bit is set). Assume each core 102 sends the size engine 504 a writeback invalidate private request 606 specifying only itself in ascending core number order. In that case, events will occur in the following order.

At time zero, core 0 sends a writeback invalidate private request 606 to the size engine 504 (e.g., at block 702 or 802 or 1202). In response, the size engine 504 sets the bit for core 0 in the writeback invalidate private request 606 row of the size engine request table 506 (at block 1204) and merges in the core bitmap specified by the request 606 (which indicates only core 0) with the core bitmask 614, which was previously clear and which will have the bit for core 0 set after the merge (at block 1208).

Since there are no other pending requests (determined at block 1302), the size engine 504 saves the bits of the size engine request table 506 associated with the writeback invalidate private request 606 type to the in-service register 507 and saves the core bitmask (which specifies only core 0) along with it (at block 1304) and clears the bits of the size engine request table 506 associated with the writeback invalidate private request 606 type and clears the core bitmask 614 (at block 1306). The size engine 504 then begins the writeback invalidate private operation associated with core 0's writeback invalidate private request 604 (at block 1312) with respect to core 0, i.e., iterating through each enabled set/way of the LLC 106 and finding cache lines that are valid in the private caches 104 of core 0 and snooping them out to the LLC 106.

Soon after, core 1 sends a writeback invalidate private request 606 to the size engine 504. The size engine 504 determines (at block 1302) that a writeback invalidate private request 606 (for core 0) is in-service and does not begin another writeback invalidate private operation, but sets the bit for core 1 associated with the request 606 in the size engine request table 506 (at block 1204) and merges the core bitmap specified by core 1's request 606 (which indicates only core 1) in with the core bitmask 614, which was previously clear and which will have the bit for core 1 set after the merge (at block 1208).

Soon after, core 2 sends a writeback invalidate private request 606 to the size engine 504. The size engine 504 determines (at block 1302) that the writeback invalidate private request 606 for core 0 is still in-service and does not begin another writeback invalidate private operation, but sets the bit for core 2 in the size engine request table 506 (at block 1204) and merges the core bitmap specified by core 2's request 606 (which indicates only core 2) in with the core bitmap 614, which previously had only the bit for core 1 set and which will now have the bits set for cores 1 and 2 (at block 1208). This advantageously fuses the requests 606 of core 1 and core 2.

Soon after, core 3 sends a writeback invalidate private request 606 to the size engine 504. The size engine 504 determines that the writeback invalidate private request 606 for core 0 is still in-service and does not begin another writeback invalidate private operation, but sets the bit for core 3 in the size engine request table 506 and merges the core bitmap specified by core 3's request 606 (which indicates only core 3) in with the core bitmap 614, which previously had the bits for cores 1 and 2 set and which will now have the bits set for cores 1, 2 and 3. This advantageously fuses the requests 606 of cores 1, 2 and 3.

Several hundreds or thousands of clocks later, the size engine 504 completes core 0's writeback invalidate private request 606 and notifies core 0 that the request 606 completed and clears the in-service register 507 (at block 1314).

Then, the size engine 504 detects (at block 1302) that there is no size engine 504 request in-service and begins the process at blocks 1304 through 1314 to perform a merged writeback invalidate private operation with respect to cores 1, 2 and 3 (e.g., at block 1312).

As may be observed from the foregoing, advantageously, the size engine 504 was able to complete four writeback invalidate private requests 606 with respect to four cores 102 in the time required to perform two writeback invalidate private operations with respect to the four cores 102, more specifically, by making only two passes through the LLC 106 iterating through all the entries 300 of the set/way combinations of the LLC 106. The fusing reduced the time required to satisfy the four requests 606 to approximately half. Furthermore, if the size engine 504 had been in-service (e.g., performing a resize operation) when core 0 sent its request 606 (and continued to be in-service when cores 1, 2 and 3 sent their requests), then the size engine 504 would have merged four of the requests 606 into a single writeback invalidate private operation, thereby saving even more time, i.e., reducing the time required to satisfy the four requests 606 to approximately one fourth.

The following example illustrates a fusing of cache management requests and some of its benefits. Assume core 0 sends the size engine 504 a resize request 608 to ten ways, and assume the current size of the LLC 106 is larger than ten ways. Assume another request (e.g., diagnostic writeback request 602) is in-service so the size engine 504 queues up the resize request 608 in the size engine request table 506. More specifically, the size engine 504 sets the resize request 608 bit for core 0 and assigns the value of ten ways to the size field 612. Then core 1 sends the size engine 504 a resize request 608 to resize to six ways. The size engine 504 sees core 0's pending request to ten ways and fuses it with core 1's request to six ways by setting the resize 608 bit for core 1 (the resize 608 bit for core 0 is already set) and updating the size 612 value to six (at block 1214). When the fused resize request 608 starts (i.e., the size engine 504 state machines begin performing the fused resize operation by sending the constituent arbitration requests into the tag and data pipelines 512/522), the size engine 504 resizes the LLC 106 to six ways and then notifies both core 0 and core 1 that their resize request 608 completed. Advantageously, this occurs transparently to core 0 and core 1 and may reduce the amount of time spent.

Figure 14:
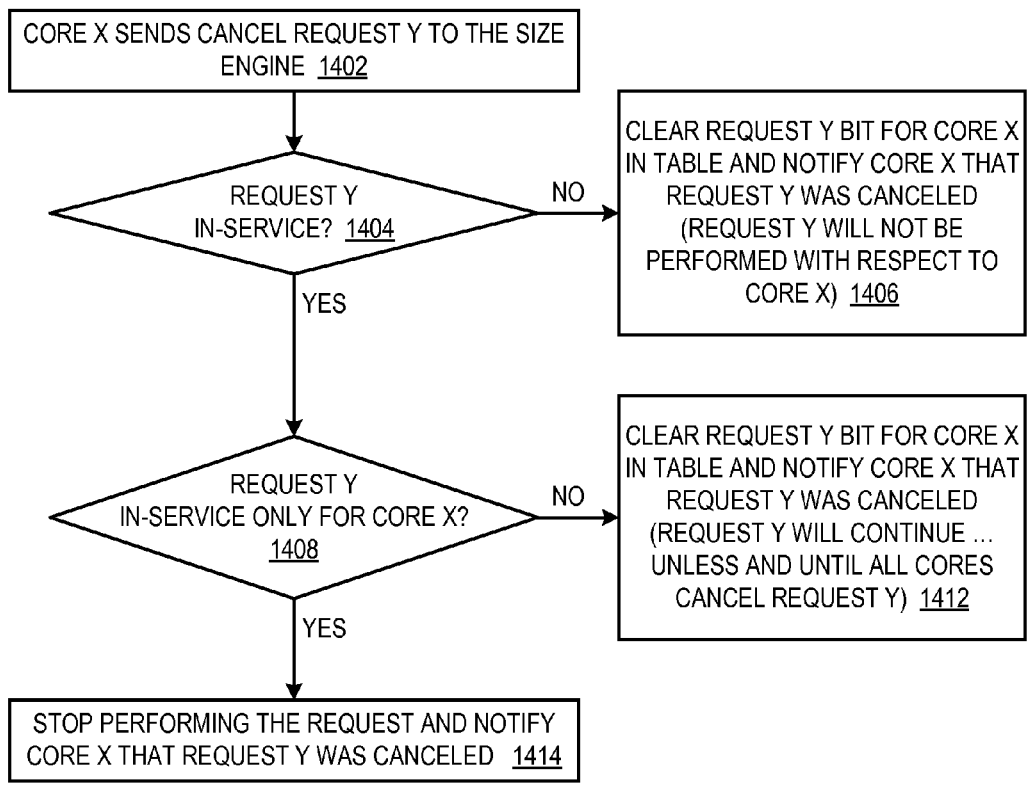
FIG. 14 is a flowchart illustrating operation of the processor of FIG. 1 in which a core cancels a size engine request.

Referring now to FIG. 14, a flowchart illustrating operation of the processor 100 of FIG. 1 in which a core 102 cancels a size engine 504 request is shown. Flow begins at block 1402.

At block 1402, a core 102, referred to as core X, sends a notification to the size engine 504 to cancel a request of one of the request types request 602/604/606/608, referred to as request Y, which the core 102 had previously sent to the size engine 504. Preferably, the core 102 does so by writing to a control register of the LLC 106. Flow proceeds to decision block 1404.

At decision block 1404, the size engine 504 determines whether the request Y is in-service, i.e., whether the size engine 504 is currently performing the operation associated with request Y. In one embodiment, the size engine 504 determines whether the request Y is in-service by examining the in-service register 507. If request Y is in-service, flow proceeds to decision block 1408; otherwise, flow proceeds to block 1406.

At block 1406, the size engine 504 clears the bit for core Y in the size engine request table 506 associated with the request Y type 602/604/606/608. Additionally, the size engine 504 notifies core X that the request Y was canceled. If the size engine 504 eventually performs the operation associated with request Y, it will not do so with respect to core X. That is, if core X was the only core 102 that had a request Y type 602/604/606/608 pending, then the size engine 504 will not perform an operation associated with the request Y 602/604/606/608. However, if the request Y type is pending for other cores 102, i.e., if the bit for one or more other cores 102 (or PPU 509) in the size engine request table 506 associated with the request Y type 602/604/606/608 is set, then the size engine 504 will perform the operation associated with the request Y type 602/604/606/608 with respect to the one or more other cores 102, but not with respect to core X. For example, if the request Y was a writeback invalidate private request 606, then the size engine 504 would perform a writeback invalidate private operation with respect to the one or more other cores 102, but not with respect to core X. Flow ends at block 1406.

At decision block 1408, the size engine 504 determines whether the request Y is in-service only for core X, i.e., for core X and not for any other cores 102. If so, flow proceeds to block 1414; otherwise, flow proceeds to block 1412.

At block 1412, the size engine 504 clears the bit for core Y in the size engine request table 506 associated with the request Y type 602/604/606/608 and notifies core X that the request Y was canceled, similar to the operation at block 1406. However, the size engine 504 continues to perform the in-service request Y operation. Preferably, the size engine 504 continues to perform the in-service request Y operation with respect to core X (as well as with respect to any other cores 102 who have their respective in-service register 507 bits set). For example, if a writeback invalidate private operation was in-service with respect to cores 1 and 3, and core 3 canceled its writeback invalidate private request 606, then the size engine 504 will continue to perform the writeback invalidate private operation with respect to both cores 1 and 3 (unless and until core 1 cancels its writeback invalidate private request 606, in which case the size engine 504 would stop performing the writeback invalidate private operation per block 1414). Flow ends at block 1412.

At block 1414, the size engine 504 stops performing the operation associated with request Y and notifies core X that the request Y was canceled. That is, the size engine 504 stops sending constituent arbitration requests to the tag pipelines 512 and/or data pipelines 522 to access the tag/MESI array 514, data array 529, uncore PRAM 524 and/or LLC registers 526 and/or sending snoop requests to the private caches 104 and/or sending requests to the bus interface unit 108 to writeback cachelines and/or metadata 304/306 onto the bus 124 and/or disabling/enabling ways of the LLC 106. Flow ends at block 1414.

The canceling of a cache management request, such as described with respect to FIG. 14 (or FIG. 15 below) may be particularly advantageous with respect to the resize request 608 as follows. In one embodiment, microcode of a core 102 decides to send a resize request 608 to the size engine 504 to reduce the size of the LLC 106 (i.e., to reduce the number of ways that are enabled in order to save power), perhaps in response to an architectural instruction executed by the operating system or because the microcode detected that the processor 100 workload is low. Assume, for example, that all sixteen ways of the LLC 106 were enabled and the resize request 608 specifies a size of six ways. Assume the size engine 504 has written back modified data for and disabled four of the ways (i.e., reduced the LLC 106 size to twelve ways) when the microcode sends a notification to the size engine 504 to cancel the resize request 608. The microcode may do so because it detects a pending interrupt request that it cannot afford to wait to service until the resize request 608 is complete. However, advantageously, four of the ways of the LLC 106 have been disabled such that when the microcode sends the resize request 608 of size six again, the size engine 504 will be able to start at a size of twelve ways, i.e., the size engine 504 will only have to writeback and disable six more ways instead of having to start at a size of sixteen ways and writeback and disable ten ways. In this manner, a ratcheting-down effect is achieved and the progress of the previous resize request 608 is preserved.

Figure 15:
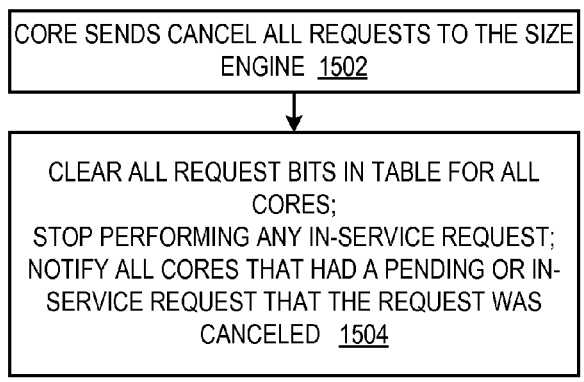
FIG. 15 is a flowchart illustrating operation of the processor of FIG. 1 in which a core cancels all requests to the size engine.

Referring now to FIG. 15, a flowchart illustrating operation of the processor 100 of FIG. 1 in which a core 102 cancels all requests to the size engine 504 is shown. Flow begins at block 1502.

At block 1502, a core 102 sends an indication to the size engine 504 to cancel all size engine 504 requests. Preferably, the core 102 does so by writing to a control register of the LLC 106. Flow proceeds to block 1504.

At block 1504, the size engine 504 clears any set bits in the size engine request table 506 associated with the request Y type 602/604/606/608 and clears the in-service register 507. Still further, the size engine 504 notifies all cores that had a set bit in the in-service register 507 or size engine request table 506 associated with the request Y type 602/604/606/608 that the request Y was canceled. Flow ends at block 1414.

While various embodiments of the present invention have been described herein, it should be understood that they have been presented by way of example, and not limitation. It will be apparent to persons skilled in the relevant computer arts that various changes in form and detail can be made therein without departing from the scope of the invention. For example, software can enable, for example, the function, fabrication, modeling, simulation, description and/or testing of the apparatus and methods described herein. This can be accomplished through the use of general programming languages (e.g., C, C++), hardware description languages (HDL) including Verilog HDL, VHDL, and so on, or other available programs. Such software can be disposed in any known computer usable medium such as magnetic tape, semiconductor, magnetic disk, or optical disc (e.g., CD-ROM, DVD-ROM, etc.), a network, wire line, wireless or other communications medium. Embodiments of the apparatus and method described herein may be included in a semiconductor intellectual property core, such as a processor core (e.g., embodied, or specified, in a HDL) and transformed to hardware in the production of integrated circuits. Additionally, the apparatus and methods described herein may be embodied as a combination of hardware and software. Thus, the present invention should not be limited by any of the exemplary embodiments described herein, but should be defined only in accordance with the following claims and their equivalents. Specifically, the present invention may be implemented within a processor device that may be used in a general-purpose computer. Finally, those skilled in the art should appreciate that they can readily use the disclosed conception and specific embodiments as a basis for designing or modifying other structures for carrying out the same purposes of the present invention without departing from the scope of the invention as defined by the appended claims.

The invention claimed is:

1. A processor, comprising:
a plurality of processing cores; and
a set-associative cache memory having a plurality of ways and shared by the plurality of processing cores, wherein the cache memory comprises a size engine that receives a respective request from each of the plurality of processing cores to perform a cache management operation on the cache memory;
wherein the size engine fuses the respective requests from two or more of the plurality of processing cores into a fused request, wherein to perform the fused request the size engine performs a single instance of the cache management operation and notifies each of the two or more of the plurality of processing cores that its respective request has been completed when the single instance of the cache management operation on the cache memory is complete;
wherein the cache memory comprises a plurality of entries, wherein each of the plurality of entries comprises storage for holding a cache line and an associated state of the cache line; and
wherein the cache management operation on the cache memory involves the size engine examining the cache line state of each entry of the plurality of entries of at least one way of the plurality of ways of the cache memory.

2. The processor of claim 1, wherein the cache management operation on the cache memory involves the size engine writing back each modified cache line in the cache memory to system memory.

3. The processor of claim 1, wherein the cache management operation on the cache memory comprises a diagnostic writeback operation.

4. The processor of claim 1, wherein the cache management operation on the cache memory comprises a writeback invalidate operation.

5. The processor of claim 1, wherein the cache management operation on the cache memory comprises an operation to resize the cache memory.

6. The processor of claim 5, further comprising:
wherein each of the respective requests specifies a respective new size of the cache memory; and
wherein when the size engine performs the single instance of the operation to resize the cache memory, the size engine resizes the cache memory to the respective new size specified by a most recent of the respective requests.

7. The processor of claim 1, further comprising:
wherein each of the plurality of processing cores includes a private cache memory;
wherein the cache management operation on the cache memory comprises a request to snoop out each modified cache line from one or more of the private cache memories into the cache memory and invalidate the one or more of the private cache memories.

8. The processor of claim 7, further comprising:
wherein each of the respective requests specifies a respective set of the plurality of processing cores whose private cache memory is to be snooped out; and
wherein the size engine snoops out the private cache memory of each of the plurality of processing cores that are in a superset that is the union of the respective sets specified in the respective requests.

9. The processor of claim 1, further comprising:
wherein one of the plurality of processing cores sends a notification to the size engine to cancel its respective request; and
wherein if the size engine has not already started servicing the fused request prior to receiving the notification, the size engine performs the single instance of the operation with respect to the remaining two or more of the plurality of processing cores whose requests were fused into the fused request and notifies the one of the plurality of processing cores that its respective request was canceled rather than completed.

10. A method for operating a processor having a plurality of processing cores and a set-associative cache memory having a plurality of ways and shared by the plurality of processing cores, the method comprising:
receiving, by the cache memory, a respective request from each of the plurality of processing cores to perform a cache management operation on the cache memory;
fusing the respective requests from two or more of the plurality of processing cores into a fused request; and
performing the fused request by performing a single instance of the cache management operation and notifying each of the two or more of the plurality of processing cores that its respective request has been completed when the single instance of the cache management operation on the cache memory is complete;
wherein the cache memory comprises a plurality of entries, wherein each of the plurality of entries comprises storage for holding a cache line and an associated state of the cache line; and
wherein the cache management operation on the cache memory involves examining the cache line state of each entry of the plurality of entries of at least one way of the plurality of ways of the cache memory.

11. The method of claim 10, wherein the cache management operation on the cache memory involves writing back each modified cache line in the cache memory to system memory.

12. The method of claim 10, wherein the cache management operation on the cache memory comprises a diagnostic writeback operation.

13. The method of claim 10, wherein the cache management operation on the cache memory comprises a writeback invalidate operation.

14. The method of claim 10, wherein the cache management operation on the cache memory comprises an operation to resize the cache memory.

15. The method of claim 14, further comprising:
wherein each of the respective requests specifies a respective new size of the cache memory; and
wherein when said performing the single instance of the operation to resize the cache memory comprises resizing the cache memory to the respective new size specified by a most recent of the respective requests.

16. The method of claim 10, further comprising:
wherein each of the plurality of processing cores includes a private cache memory;
wherein the cache management operation on the cache memory comprises a request to snoop out each modified cache line from one or more of the private cache memories into the cache memory and invalidate the one or more of the private cache memories.

17. The method of claim 16, further comprising:
wherein each of the respective requests specifies a respective set of the plurality of processing cores whose private cache memory is to be snooped out; and
snooping out the private cache memory of each of the plurality of processing cores that are in a superset that is the union of the respective sets specified in the respective requests.

18. The method of claim 10, further comprising:
sending, by one of the plurality of processing cores, a notification to the size engine to cancel its respective request; and
if the size engine has not already started servicing the fused request prior to receiving the notification, performing the single instance of the operation with respect to the remaining two or more of the plurality of processing cores whose requests were fused into the fused request and notifying the one of the plurality of processing cores that its respective request was canceled rather than completed.

19. A computer program product encoded in at least one non-transitory computer usable medium for use with a computing device, the computer program product comprising:
- computer usable program code embodied in said medium, for specifying a processor, the computer usable program code comprising:
  - first program code for specifying a plurality of processing cores; and
  - second program code for specifying a set-associative cache memory having a plurality of ways and shared by the plurality of processing cores, wherein the cache memory comprises a size engine that receives a respective request from each of the plurality of processing cores to perform a cache management operation on the cache memory; and
- wherein the size engine fuses the respective requests from two or more of the plurality of processing cores into a fused request, wherein to perform the fused request the size engine performs a single instance of the cache management operation and notifies each of the two or more of the plurality of processing cores that its respective request has been completed when the single instance of the cache management operation on the cache memory is complete;
- wherein the cache memory comprises a plurality of entries, wherein each of the plurality of entries comprises storage for holding a cache line and an associated state of the cache line; and
- wherein the cache management operation on the cache memory involves the size engine examining the cache line state of each entry of the plurality of entries of at least one way of the plurality of ways of the cache memory.

20. The computer program product of claim 19, wherein the at least one non-transitory computer usable medium is selected from the set of a disk, tape, or other magnetic, optical, or electronic storage medium.

* * * * *